United States Patent [19]
Peterson et al.

[11] Patent Number: 6,010,009
[45] Date of Patent: Jan. 4, 2000

[54] SHIPPING AND TRANSPORT CASSETTE WITH KINEMATIC COUPLING

[75] Inventors: Kelly Peterson, Savage; Brian Wiseman, Oakdale, both of Minn.; Gary Gallagher, Colorado Springs, Colo.; Barry Gregerson, Deephaven, Minn.

[73] Assignee: Empak, Inc., Chanhassen, Minn.

[21] Appl. No.: 08/913,259

[22] PCT Filed: Oct. 13, 1995

[86] PCT No.: PCT/US95/12515

§ 371 Date: Sep. 10, 1997

§ 102(e) Date: Sep. 10, 1997

[87] PCT Pub. No.: WO97/13709

PCT Pub. Date: Apr. 17, 1997

[51] Int. Cl.⁷ .................................................. B65D 85/90
[52] U.S. Cl. ...................... 206/711; 206/454; 211/41.18
[58] Field of Search .................................. 206/710–712, 206/832–833, 454; 118/500; 211/41.18

[56] References Cited

U.S. PATENT DOCUMENTS

| 4,588,086 | 5/1986 | Coe | 206/454 |
| 4,817,795 | 4/1989 | Kos | 206/454 |
| 5,111,936 | 5/1992 | Kos | 206/454 |

*Primary Examiner*—Jim Foster
*Attorney, Agent, or Firm*—Douglas J. Christensen

[57] ABSTRACT

A cassette (10) for storing a plurality of items in a parallel registration is disclosed. The cassette is specifically designed to be lightweight and is reinforced (50, 52, 54) to prevent warpage, bending, flexing or breaking of the cassette. Means (66, 68, 70) for indexing the cassette to a surface for precise insertion and removal of items are also described.

12 Claims, 7 Drawing Sheets

SHIPPING AND TRANSPORT CASSETTE WITH KINEMATIC COUPLING

BACKGROUND OF THE INVENTION

I. Field of the Invention

The present invention relates to a cassette used for shipping and transporting various items. More specifically, the invention relates to cassettes specifically designed for holding wafers, rigid memory disks, flat panel displays, liquid crystal displays, or photomasks. The invention is particularly advantageous when used to hold relatively large items such as wafers having, for example, a diameter of 300 mm or more. However, cassettes made in accordance with the invention can also be used to hold smaller items.

II. Description of the Prior Art

Various containers have been used in the prior art to hold silicon wafers, rigid memory disks, flat panel displays, liquid crystal displays and the like. Such items must be protected as they are transported from point to point within a manufacturing facility because they tend to be very fragile. Loading such items into cassettes for transport has proven to be an effective means of providing protection.

Early cassettes were heavy, bulky and expensive. These early cassettes also were not well adapted to the environment in which they had to function. The heat and harsh chemicals used in such environments often weakened such prior art cassettes causing them to bend, flex, warp or even break during processing. Such damage to the cassette would often destroy the items stored in the cassette.

Later cassette designs sought to overcome the disadvantages of the prior art by providing various gussets, supports or H-bars to reinforce the cassette to prevent such warpage. Also, materials such as Teflon® were used. These materials were selected to withstand chemical etching processes to which the items are routinely subjected. Such techniques were adequate for cassettes designed to hold smaller items such as those having a length or diameter of approximately 150 mm or less. However, given recent trends in the semiconductor and electronics industry, new cassette designs are needed which can accommodate items of a larger size. Such cassettes must be designed so that they will not flex, warp, bend or break, even when subjected to high temperatures or harsh chemicals. Further, given the size and weight of such items, robotic handling becomes more and more important thereby requiring structures on the cassette which can assist in indexing and positioning the cassette with respect to processing equipment.

SUMMARY OF THE INVENTION

The present invention is directed toward cassettes specifically designed to accommodate large diameter wafers (i.e., those having a diameter of 300 mm or more) and other items similar in size. Such cassettes can be used to hold smaller items as well. Unique reinforcement structures are provided which prevent warpage, bending, flexing or breaking of the cassette while in use. These reinforcements structures are designed in such a way that the amount of material used to make the cassette is reduced, thereby reducing cost and weight.

The present invention also provides cassettes which are easily cleaned. Such cassettes are able to hold the items in spaced apart, parallel orientation so that the items do not come in contact with each other, causing damage. The cassettes also include a set of grooves used to kinematically couple the cassettes to equipment used in the processing or handling of the items. These kinematic grooves can be used, for example, to register the cassette inside a microenvironment pod to help protect the items during shipping and transport.

In view of the foregoing, one object of the invention is to provide a cassette which is able to hold, for example, a plurality of wafers, each wafer having a diameter of 300 mm or more.

Another object of the invention is to provide a cassette having suitable reinforcements, given its size, to prevent warpage, bending, flexing or breaking of the cassette even when the cassette is subjected to harsh chemicals or high temperatures.

Still a further object of the invention is to provide a cassette capable of holding a plurality of items in a spaced apart, parallel orientation with respect to each other.

Still another object of the invention is provide such a cassette which includes a kinematic coupling so that the cassette can be aligned with processing equipment or appropriately positioned in a microenvironment pod.

Still another object of the invention is to provide such a cassette which has an open top and open bottom.

Still another object of the invention is to provide such a cassette wherein all surfaces of the cassette are easily cleaned and decontaminated.

These and other objects of the invention will become more apparent from the reading of the detailed description of the preferred embodiment set forth below in conjunction with the drawings all of which form part of this specification.

DESCRIPTION OF THE PREFERRED EMBODIMENT

As indicated above, the present invention provides cassettes which can hold items such as silicon wafers, rigid memory disks, flat panel displays, liquid crystal displays, and photomasks, substrates, or the like. So that it is not necessary to continually repeat this entire list, the drawings and description set forth below are provided in terms of a "wafer" cassette. Those skilled in the art should recognize that the benefits of the invention apply equally to all such items and that there is no intention that this in any way be limiting. The various components of the cassette should be constructed of materials with low outgassing characteristics which are durable and exhibit little, if any, particulation.

The wafer cassette 10 of the preferred embodiment includes a first open side 20, a second open side 22, a first end wall 12, a pair of opposing side walls 14 and 16, and a second end wall 18. The first open side 20 is large enough to permit wafers to be inserted into or removed from the cassette 10. The second open side 22 is small enough so that the wafers are supported within the cassette 10, but large enough to let liquid chemicals readily pass through the cassette 10 between any wafers stored within the cassette.

The two side walls 14 and 16 are the mirror image of each other. Each side wall has an interior surface 23, and an exterior surface 24, a lower member 25, an intermediate member 26, and an upper member 28. Members 25, 26 and 28 of each sidewall are integrally formed so that the top of intermediate member 26 is at a position above and outside the top of lower member 25. The upper member 28 projects upwardly from the top of the intermediate member 26. Projecting outwardly from the planar outer surface 24 of the upper member 28 are an upper reinforcing rail 34 and a lower reinforcing rail 36. Rails 34 and 36 help support the cassette 10 and also provide a means by which a robotic arm can effectively grip and hold the cassette.

Figure 1:
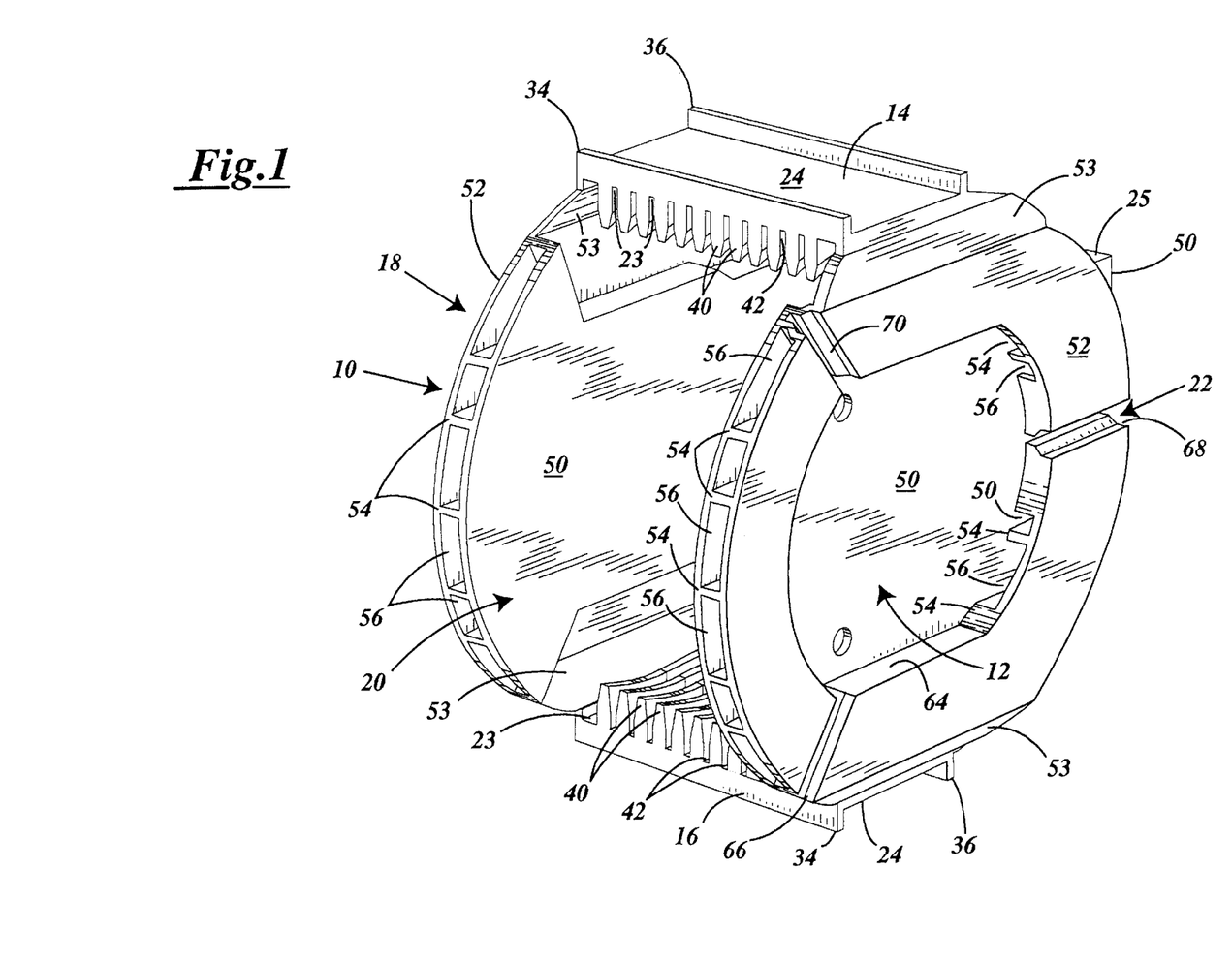
FIG. 1 is a perspective view of a cassette incorporating the features of the present invention.
Figure 2:
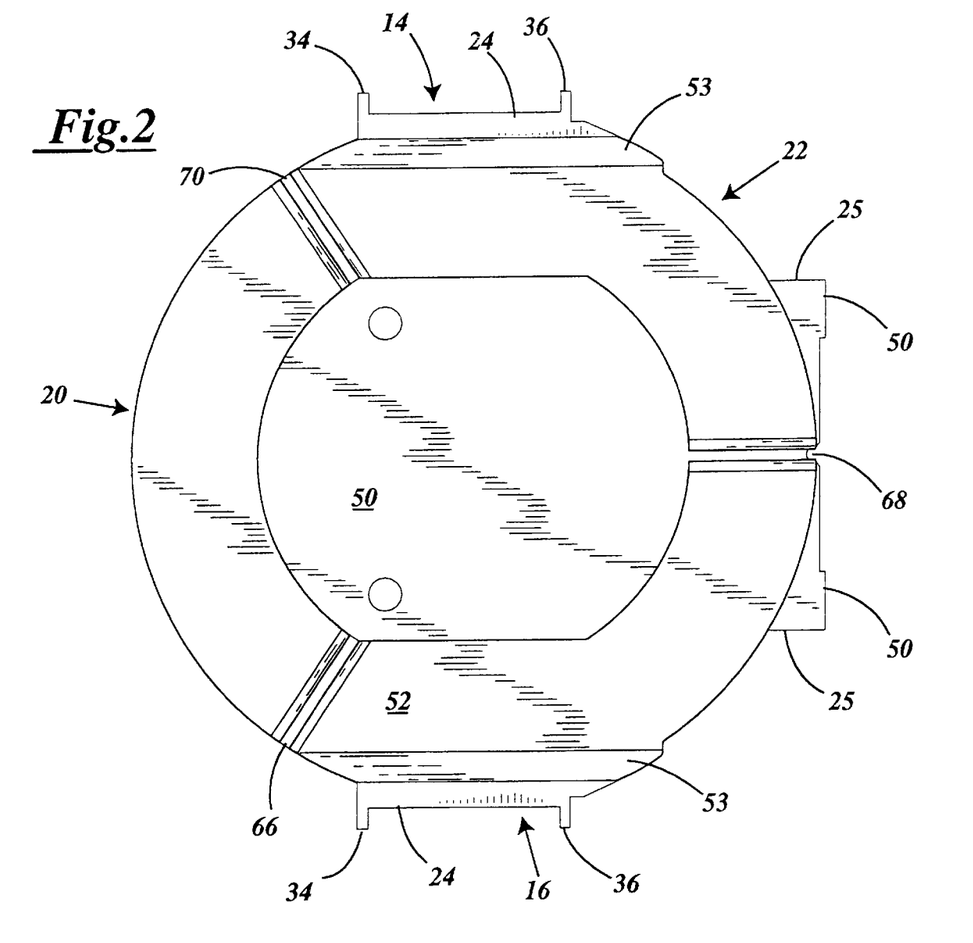
FIG. 2 is an elevational view of one of the ends of the cassette of the present invention.
Figure 3:
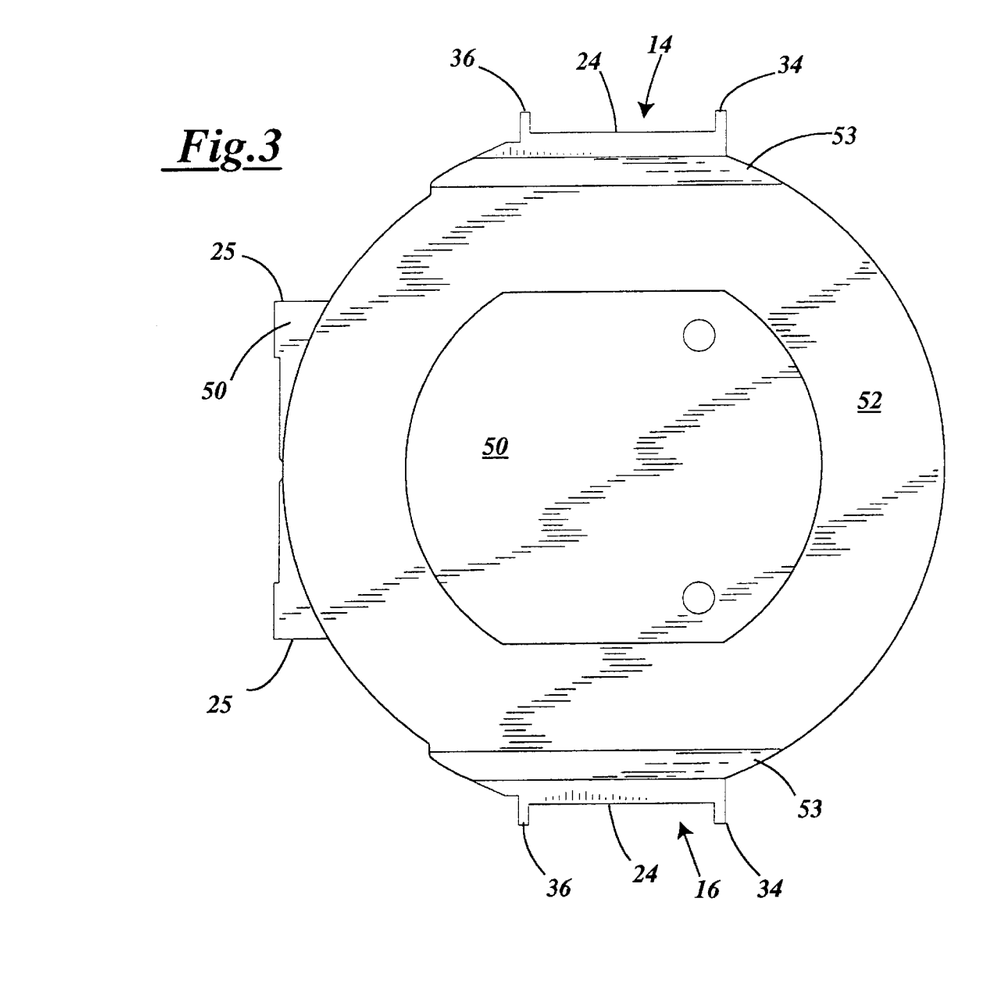
FIG. 3 is an elevational view of the end of the cassette opposite that shown in FIG. 2.
Figure 4:
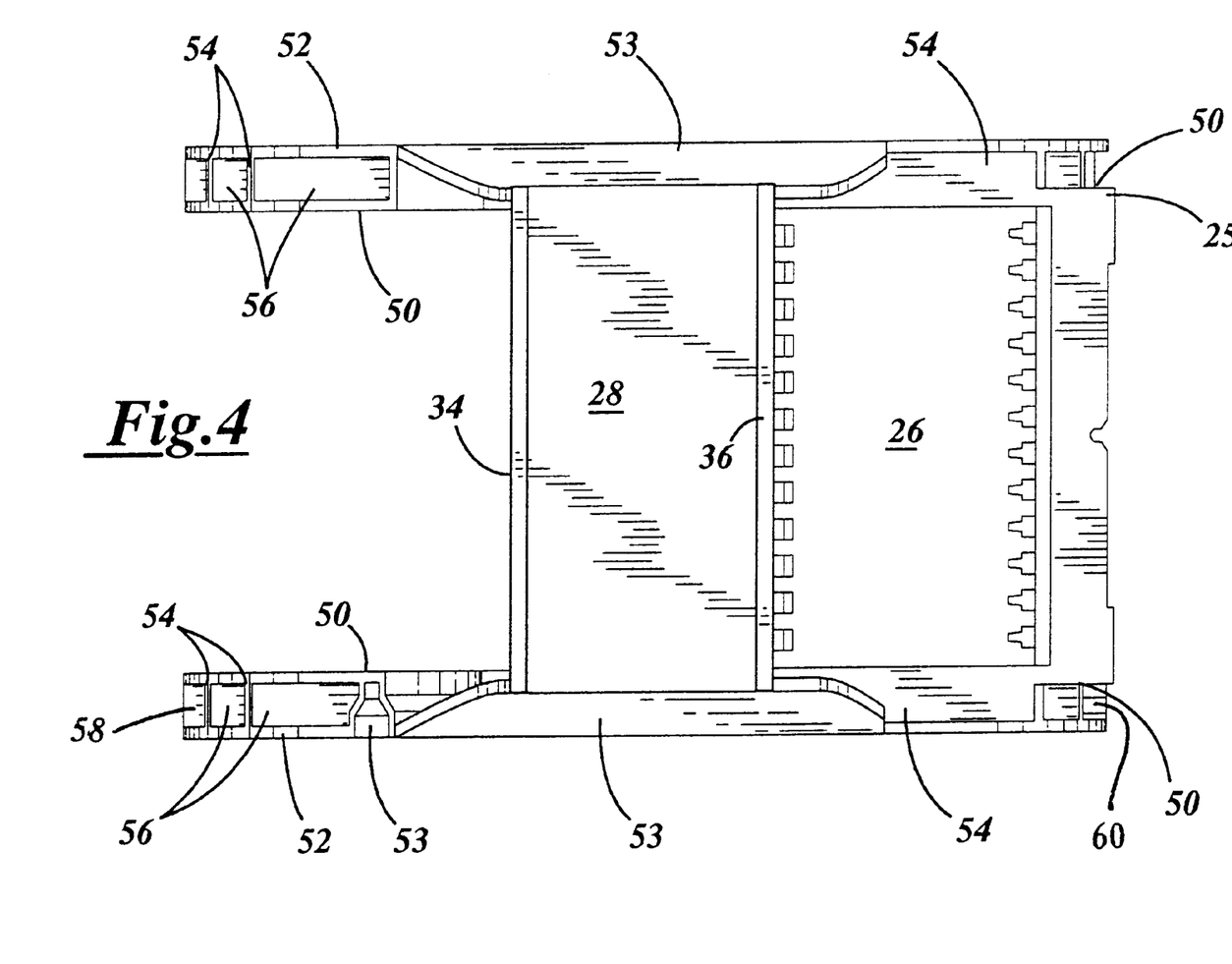
FIG. 4 is an elevational view of one side of the cassette.
Figure 5:
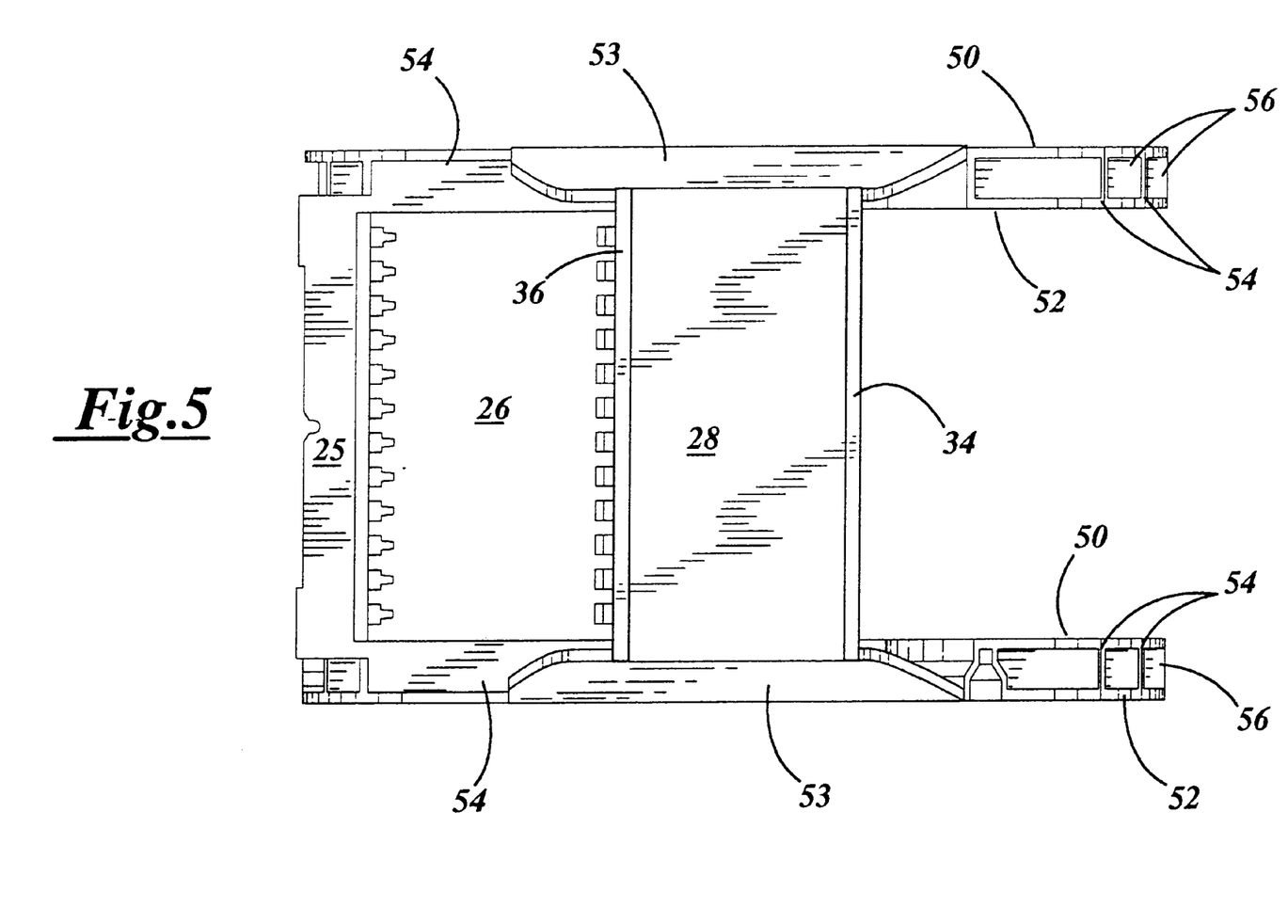
FIG. 5 is an elevational view of the side of the cassette opposite that shown in FIG. 4.
Figure 6:
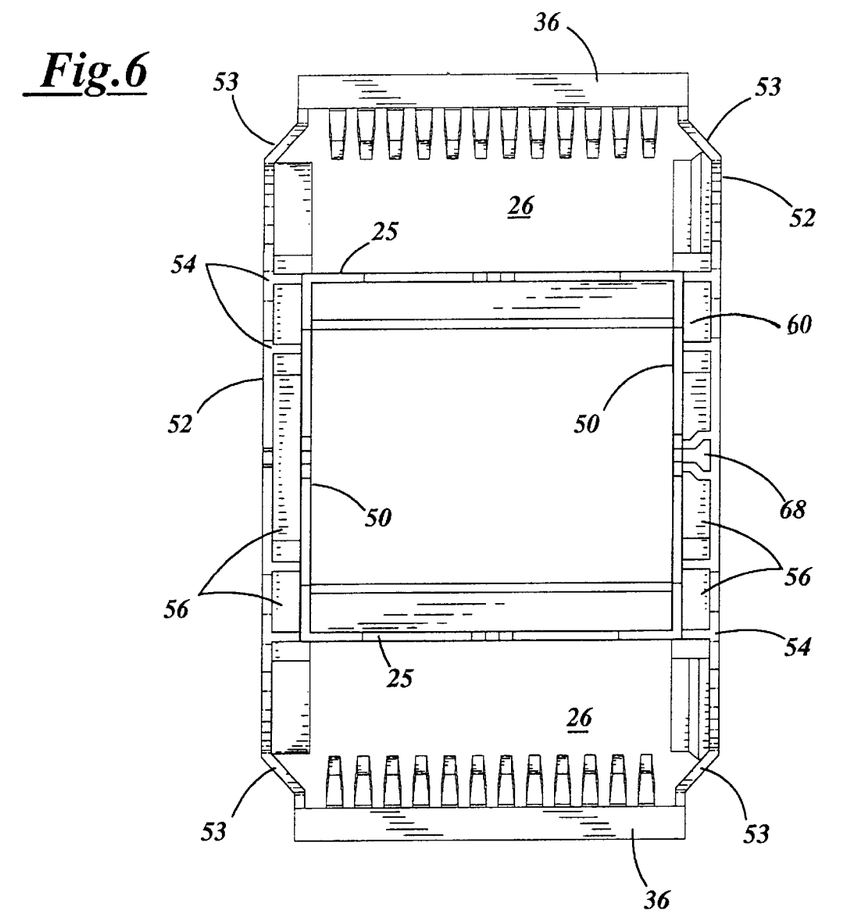
FIG. 6 is a bottom plan view of the cassette.
Figure 7:
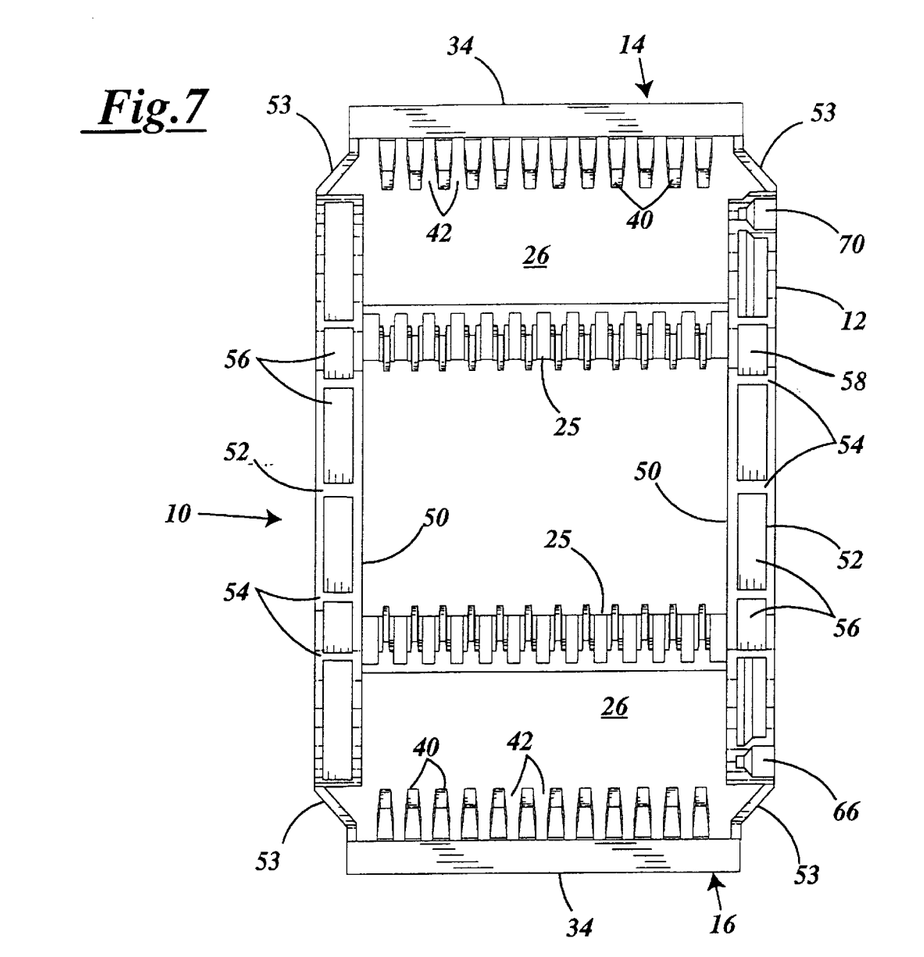
FIG. 7 is a top plan view of the cassette.
Figure 8:
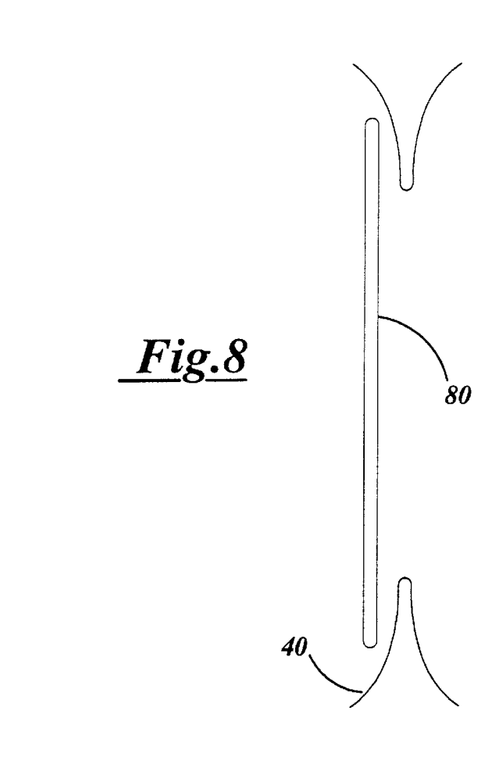
FIG. 8 is a cross section showing two opposing dividers and a wafer.

The cassette 10 also includes a plurality of dividers 40 on the interior surface 23 of each side wall 14 and 16. The dividers 40 generally extend from the top of upper member 28 to the bottom of intermediate member 26. The dividers 40 on side wall 14 oppose those on side wall 16. The dividers 40 serve to hold each wafer in a parallel, spaced apart, non-contacting relationship with respect to the other wafers stored in the cassette. The dividers 40, in the longitudinal direction, have a radius of curvature mirroring that of the wafer. The dividers 40 are also tapered in the transverse direction to reduce the likelihood of damage to the wafers as the wafers are placed into or removed from the cassette 10. More specifically as shown in FIG. 8, the dividers 40 have a continuously varying slope which is used to center the wafer in the middle of the carrier when the wafers are oriented in a horizontal direction. The slope may range from vertical at the wall to completely horizontal at the very edge of the divider. Given this configuration, the wafer should always rest on a portion of the divider that has a finite slope, so edge contact is guaranteed. When the wafers 80 are transported horizontally, gravity helps center the wafers 80 given the configuration of these dividers 40. Once centered, the wafer's vertical location is precisely defined. Further, as the container is moved from one location to the next, small levels of vibration help center the wafer in the container. This assists in improving horizontal positional accuracy of the wafers as well as the vertical positional accuracy.

Additional benefits are provided by this divider design. For example, it presents the lowest possible cross section for a given strength. The dividers 40 present an area of interference for the wafer as it is inserted and removed from the carrier, thus, thin supports are preferred because there is less chance of the wafer 80 hitting the divider 40 and causing particles to be generated. Also, the dividers are strong enough to support the wafer and to avoid deflection over the life of the container.

Between each pair of dividers 40 is a wafer receiving groove 42. At least a portion of the back side of the groove 42 has a radius of curvature in the longitudinal direction which is generally the same as the radius of curvature of the wafer around the wafer's circumference. The configuration is advantageous because the wafer is supported by the groove 42 along a line rather than at a single point. Such support improves stability of the wafers within the cassette. Such support also aids in ensuring that the wafers are completely horizontal when the cassette 10 is docked to a wafer transfer tool. The side walls 14 and 16 of the cassette 10 are spaced from each other a distance suitable for receiving and storing wafers of a particular diameter, for example, 300 mm. The cassette can be sized to hold any number of wafers. Two typical configurations would be thirteen and twenty-five capacity cassettes. The number of dividers 40 changes depending on the capacity of the cassette.

The dividers 40 and grooves 42 are preferably oriented to achieve certain advantages. First, they are oriented to hold the wafers at a predetermined pitch in the range of 5 mm to 12 mm. Second, they are oriented to provide a clearance of 3 mm to 8 mm between wafers. Third, a clearance of 1 mm to 3 mm is provided between each of the side walls 14 and 16 of the cassette 10 and the edges of the wafers at the diameter of the wafer parallel to the plane of the open sides 20 and 22. Providing such a pitch and these clearances ensures that the wafers do not touch each other in the cassette. Also, these clearances are sufficient to permit robotic insertion and removal of wafers when the cassette is docked to the wafer transfer tool.

Several unique features of the design reside in the construction of first end wall 12. The first end wall 12 consists of a first plate 50, a second plate 52 and a plurality of bridging members 54 separated by channels 56. Plates 50 and 52 are securely held apart and parallel to each other by the bridging members 54 Each of the channels 56 are formed by a portion of the first plate 50, a portion of the second plate 52, and two of the bridging members 54. The channels 56 each have an open top 58 and an open bottom 60 so fluids can readily pass through the channels 56 during processing of wafers or cleaning of the cassette. There are no closed corners or the like in the channels which are difficult to clean or where fluid can collect or be trapped during cleaning of the cassette 10 or processing of the wafers.

Plate 50 is generally flat. Plate 52 is also generally flat, but has a large opening 64 in the center. Formed in the face of second plate 52 and extending back to the first plate 50 are three kinematic coupling grooves 66, 68 and 70. These grooves can be used to index the cassette to another object, such as the port of wafer processing equipment. The grooves 66, 68 and 70 cooperate with three complementary projections on the object designed to mate with the grooves 66, 68 and 70 to achieve proper alignment of the cassette 10. Those skilled in the art will recognize that alternative arrangements exist for providing the kinematic grooves 66, 68 and 70. For example, the grooves could be molded into a separate block which is then attached to plate 52 with screws, pins, or an ultrasonic weld, or an adhesive bond.

Many of the advantages are derived from a front wall 12 having this design. First, the combination of the two plates 50 and 52 and bringing members 54 reduces warpage or bending of the walls. Second, the design is very easy to clean and is readily capable of draining fluids during processing of wafers. This is because the channels 56 have an open top and bottom. There are no spaces which are blocked in such a way as to cause fluids to collect in the cassette 10. Third, the kinematic coupling grooves 66, 68 and 70, when mated with complementary projections on a surface, simplify positioning of the cassette 10 on the surface. Fourth, less plastic is required and the overall design is lighter. Fifth, the cassette 10 can be easily gripped by the human hand or robotic tool because of the opening 64 in plate 52. The cassette 10 can also be gripped from the sides by a robotic tool because of the reinforcing rails 34 and 36.

The design of the first wall 12 results in a unique way of joining it to the two side walls 14 and 16. Opposite side edges of the lower portion of first plate 50 are joined at approximately a right angle with the lower member 25 of each of the opposing side walls 14 and 16. Opposite edged of plate 52 are also joined to the upper member 28 of each of the side walls 14 and 16. This is achieved by providing angled panels 53 between the plate 52 and upper members 28 of the side walls. The panels 53, being angled with respect to both plate 52 and upper member 28, assist in strengthening the overall design.

The second wall 18 of the cassette 10 can have the identical design as the first end wall 12. However, it is generally not necessary for both the first and second end walls to have the kinematic coupling grooves such as 66, 68 and 70. Thus, such grooves are not shown on the second end wall 18 in the drawings.

As set forth above, the present invention offers many advantages which are not limited to the storage and transfer of silicon wafers. This same invention can successfully be used to store and transfer rigid memory disks, photomasks, liquid crystal displays, flat panel displays, substrates, and the like. Various modifications and additions can be made to the cassette disclosed herein and may be made without departing from the invention which is intended to be defined by the claims set forth below.

What is claimed is:

1. A cassette for holding a plurality of items comprising:
   (a) a first open side;
   (b) a second open side;
   (c) a first side wall and a second side wall, each of said side walls having an interior surface and a plurality of dividers extending inwardly from said interior surface, said first and second side walls cooperating to support a plurality of items within the cassette so that each item supported by said first and second side walls is in a parallel, spaced apart, non-contacting relationship with respect to each of the other of said plurality of items;
   (d) a first end wall and a second end wall each integrally formed with said side walls, said first end wall having:
      (i) a first plate;
      (ii) a second plate;
      (iii) a plurality of bridging members designed to securely hold said first plate and said second plate apart and parallel to each other; and
      (iv) a plurality of channels, each channel formed by a portion of said first plate, a portion of said second plate and a pair of said plurality of bridging members, each channel having an open top and an open bottom so that fluids can readily pass through said channel and not become trapped therein.

2. The cassette of claim 1 wherein said second plate has a large central opening.

3. The cassette of claim 1 further including a first set of at least three grooves for kinematically positioning the cassette with respect to another object.

4. The cassette of claim 1 wherein said second end wall also has:
   (a) a first plate;
   (b) a second plate;
   (c) a plurality of bridging members designed to securely hold said first plate and said second plate apart and parallel to each other; and
   (d) a plurality of channels, each channel formed by a portion of said first plate, a portion of said second plate, and a pair of said plurality of bridging members, each channel having an open top and an open bottom so that fluids can readily pass through said channel and not become trapped therein.

5. The cassette of claim 4 wherein said second plate of said first end wall and said second plate of said second end wall each have a large central opening.

6. The cassette of claim 3 further including a second set of at least three grooves, either said first set or said second set capable of being used to kinematically position the cassette with respect to another object.

7. The cassette of claim 1 wherein each of said side walls have a lower member, an intermediate member and an upper member.

8. The cassette of claim 7 wherein the upper member of each side wall has a pair of outwardly projecting rails.

9. The cassette of claim 7 wherein the lower member of each of said side walls is directly attached to the first plate of each of said end walls.

10. The cassette of claim 7 wherein separate panels are provided at opposite ends of the upper member of each side wall for attaching the upper member of each side wall to the second plate of each of end wall.

11. The cassette of claim 1 wherein item-receiving grooves are formed by pairs of said plurality of dividers, a portion of the backside of each groove having a radius of curvature in the longitudinal direction of the groove which is generally the same as the radius of curvature of the items held within the cassette around the circumference of the items.

12. The cassette of claim 1 wherein at least some of said dividers have a continuously varying slope to help support a wafer.

* * * * *